US011302551B2

(12) United States Patent
Morikuni

(10) Patent No.: US 11,302,551 B2
(45) Date of Patent: Apr. 12, 2022

(54) CONVEYANCE APPARATUS, SUBSTRATE PROCESSING APPARATUS, AND METHOD OF MANUFACTURING ARTICLE

(71) Applicant: CANON KABUSHIKI KAISHA, Tokyo (JP)

(72) Inventor: Yuichiro Morikuni, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 130 days.

(21) Appl. No.: 16/711,937

(22) Filed: Dec. 12, 2019

(65) Prior Publication Data
US 2020/0203204 A1 Jun. 25, 2020

(30) Foreign Application Priority Data

Dec. 21, 2018 (JP) .............................. JP2018-240140

(51) Int. Cl.
*H01L 21/677* (2006.01)
*H01L 21/67* (2006.01)
*H01L 21/687* (2006.01)
*H01L 21/68* (2006.01)

(52) U.S. Cl.
CPC .. *H01L 21/67742* (2013.01); *H01L 21/67248* (2013.01); *H01L 21/67265* (2013.01); *H01L 21/681* (2013.01); *H01L 21/682* (2013.01); *H01L 21/68707* (2013.01)

(58) Field of Classification Search
CPC ......... H01L 21/67742; H01L 21/67745; H01L 21/67748; H01L 21/68707; H01L 21/68
See application file for complete search history.

(56) References Cited

U.S. PATENT DOCUMENTS

| 2005/0140959 | A1* | 6/2005 | Tsuji | G03F 7/70875 355/72 |
| 2013/0180448 | A1* | 7/2013 | Sakaue | H01L 21/67742 118/696 |
| 2016/0057306 | A1* | 2/2016 | Kido | H04N 1/32037 358/1.13 |
| 2017/0323816 | A1* | 11/2017 | Sato | H01L 21/67 |
| 2017/0347506 | A1* | 11/2017 | Kamio | H05K 13/0408 |

(Continued)

FOREIGN PATENT DOCUMENTS

JP 2005242743 A 9/2005

*Primary Examiner* — Mohammad Ali
*Assistant Examiner* — Vincent W Chang
(74) *Attorney, Agent, or Firm* — Rossi, Kimms & McDowell LLP

(57) ABSTRACT

A conveyance apparatus comprises a first movable device to move while holding an object, a second movable device to move while holding the object and transfer the object to the first movable device, and a controller to control the first and second movable devices. The second movable device includes a guide member and a hand arranged so as to be capable of reciprocally moving along the guide member while holding the object. The controller estimates, based on a driving history of the second movable device, a thermal deformation amount of the guide member corresponding to the reciprocal movement of the hand along the guide member, and corrects, based on the estimated thermal deformation amount, a drive command value used to move the first movable device to a position to receive the object from the second movable device.

11 Claims, 6 Drawing Sheets

(56) References Cited

U.S. PATENT DOCUMENTS

2020/0221618 A1\* 7/2020 Kawai ................ H05K 13/0818
2020/0375075 A1\* 11/2020 Oyama .............. H05K 13/0406
2020/0404817 A1\* 12/2020 Onishi ............... H05K 13/0069

\* cited by examiner

CONVEYANCE APPARATUS, SUBSTRATE PROCESSING APPARATUS, AND METHOD OF MANUFACTURING ARTICLE

BACKGROUND OF THE INVENTION

Field of the Invention

The present invention relates to a conveyance apparatus, a substrate processing apparatus, and a method of manufacturing an article.

Description of the Related Art

A conveyance apparatus that conveys an object is used in, for example, a substrate processing apparatus such as an exposure apparatus or the like which forms a pattern on a substrate. For example, in an exposure apparatus, the conveyance apparatus will convey a substrate or an original as an object. In the exposure apparatus, for example, a substrate is conveyed by the conveyance apparatus and transferred to a substrate stage. Since the driving stop position of a conveyance mechanism changes in each driving operation, the position where the conveyance mechanism transfers the substrate to the substrate stage is not constant. In a similar manner, the positional relationship between the substrate and the substrate stage will not be constant either since the substrate transfer position is not constant. To cope with this state, Japanese Patent Laid-Open No. 2005-242743 discloses a technique to make the positional relationship between a substrate and a holder constant.

In particular, in a substrate processing apparatus such an exposure apparatus or the like, there is a demand for further improvement in the positioning accuracy of an object such as a substrate when the object is to be transferred (to be loaded).

SUMMARY OF THE INVENTION

The present invention provides a technique advantageous in the point of the positioning accuracy of an object when the object is to be transferred.

The present invention in its one aspect provides a conveyance apparatus comprising a first movable device configured to move while holding an object, a second movable device configured to move while holding the object and transfer the object to the first movable device, and a controller configured to control the first movable device and the second movable device, wherein the second movable device includes a guide member and a hand arranged so as to be capable of reciprocally moving along the guide member while holding the object, and the controller estimates, based on a driving history of the second movable device, a thermal deformation amount of the guide member corresponding to the reciprocal movement of the hand along the guide member, and the controller corrects, based on the estimated thermal deformation amount, a drive command value used to move the first movable device to a position to receive the object from the second movable device.

Further features of the present invention will become apparent from the following description of exemplary embodiments (with reference to the attached drawings).

DESCRIPTION OF THE EMBODIMENTS

Figure 1:
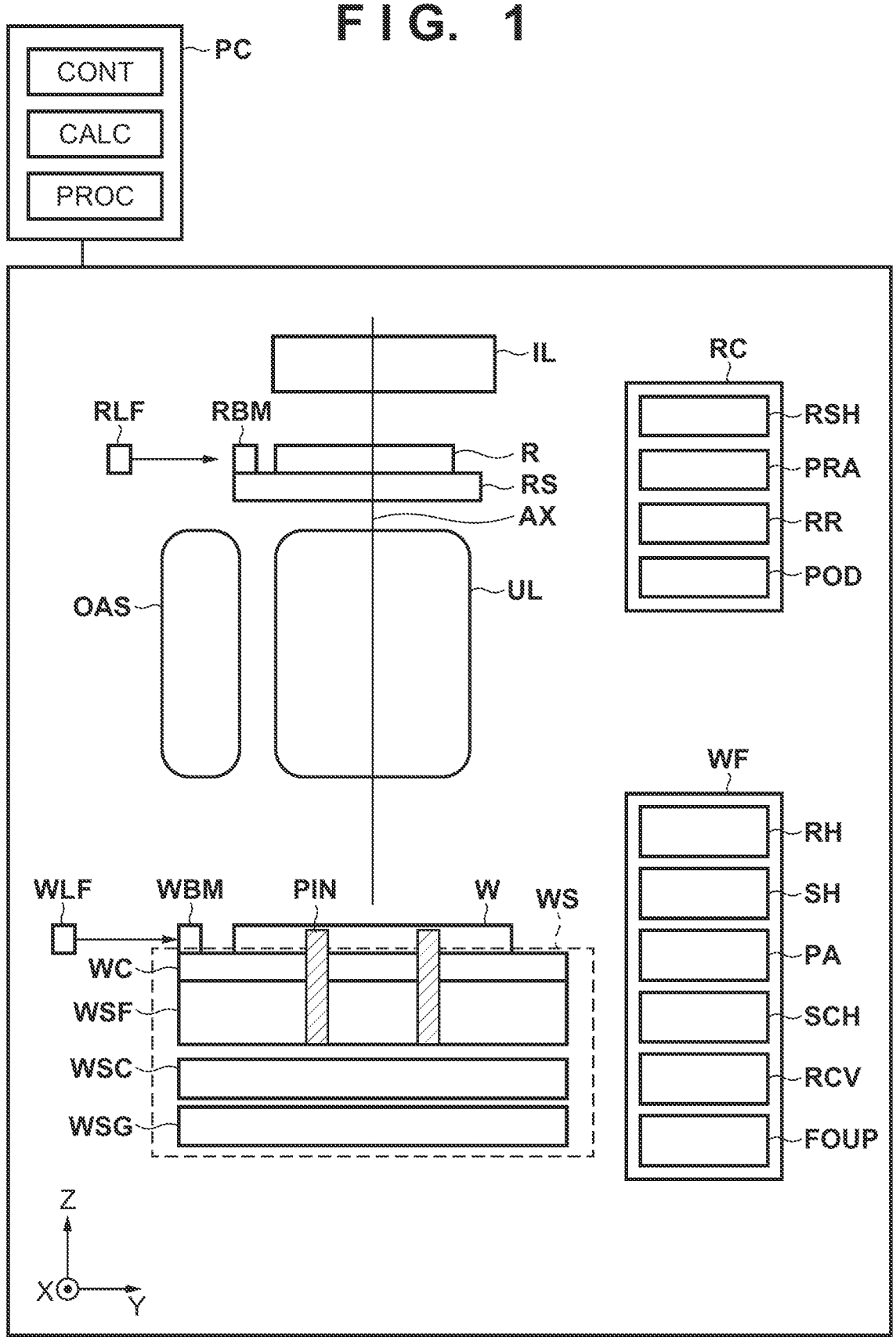
FIG. 1 is a schematic view showing the arrangement of an exposure apparatus according to the first embodiment.

Embodiments of the present invention will be described in detail below with reference to the accompanying drawings. Note that the following embodiments do not limit the invention of the appended claims. Although a plurality of characteristic features are described in the embodiments, not all of the characteristic features are essential to the present invention, and the plurality of characteristic features may be arbitrarily combined. Furthermore, same reference numerals are used to denote same arrangements or arrangements similar to each other in the accompanying drawings, and a repetitive description thereof will be omitted.

First Embodiment

This embodiment will describe an example in which a conveyance apparatus that conveys an object is used in a substrate processing apparatus that forms a pattern on a substrate. In this case, an object can be an original or a substrate. The substrate processing apparatus can be any one of, for example, a lithography apparatus (an imprint apparatus, an exposure apparatus, a charged particle beam drawing apparatus, or the like), a deposition apparatus (a CVD apparatus or the like), a processing apparatus (a laser processing apparatus or the like), and an inspection apparatus (an overlay inspection apparatus or the like). An imprint apparatus forms a pattern on a substrate by curing an imprint material while bringing a mold (original) into contact with the imprint material supplied on the substrate. An exposure apparatus exposes, via an original (reticle) serving as an original mask, a photoresist supplied on a substrate to form a latent image corresponding to the pattern of an original on the photoresist. A charged particle beam drawing apparatus uses a charged particle beam to draw a pattern on a photoresist supplied on a substrate and form a latent image on the photoresist. An example in which the substrate processing apparatus is formed as an exposure apparatus will be described to provide a more specific example hereinafter.

Figure 2:
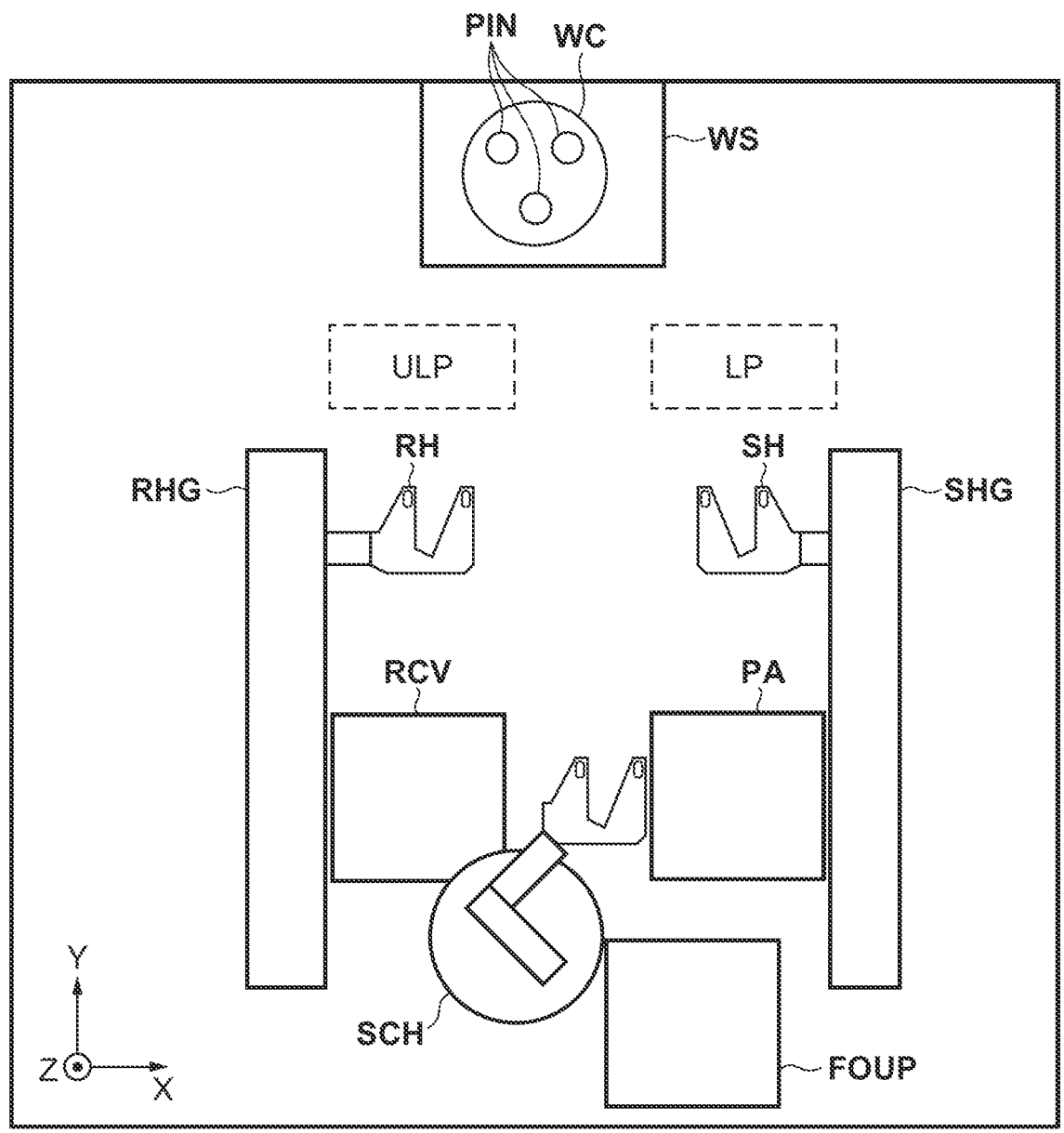
FIG. 2 is a plan view of principal parts of the exposure apparatus according to the first embodiment.

FIG. 1 is a schematic view showing the arrangement of an exposure apparatus according to the first embodiment. FIG. 2 is a plan view of principal parts in which the exposure apparatus is seen from the +Z direction. In this specification, directions are indicated in an XYZ-coordinate system in which an XY plane is set as the horizontal plane. In general, a substrate W is handled so that its surface will be parallel to the horizontal plane (XY plane). Directions parallel to the X-axis, the Y-axis, and the Z-axis will be set as the X direction, the Y direction, and the Z direction, respectively. Reference symbols θx, θy, and θz denote the rotation about the X-axis, the rotation about the Y-axis, and the rotation about the Z-axis, respectively.

In an exposure apparatus, an exposure light, which is emitted from a light source (not shown) and guided through an illumination optical system IL, irradiates a reticle R serving as an exposure mask (an original). The exposure light that passed through the reticle R passes through a reduction projection lens UL and irradiates the wafer W serving as the substrate.

A reticle stage (original stage) RS includes a chuck which serves as an original holder (not shown). The reticle stage RS uses the chuck to chuck and hold a reticle. The reticle stage RS can be driven straight in the X, Y, and Z directions and rotatably driven in the θx, θy, and θz directions. The driving operations in the respective directions can be controlled independently.

A laser interferometer RLF and a plane mirror RBM are arranged to measure the position of the reticle stage RS with high accuracy. The position of the reticle stage can be determined from a change amount measured by the laser interferometer RLF.

A reticle conveyance system RC can include a reticle hand RSH, a reticle pre-alignment stage PRA, a reticle conveyance robot RR, and a container POD. The reticle conveyance robot RR is, for example, a multi-jointed robot. The reticle conveyance robot RR includes a hand for holding the reticle R, and this hand can be moved to arbitrary positions in the XYZ space. The container POD is a table for containing the reticle R. The reticle R can be placed in the container POD from outside the apparatus. The reticle R placed in the container POD is placed on the reticle pre-alignment stage PRA by the reticle conveyance robot RR.

The positional relationship between the reticle R and the reticle pre-alignment stage PRA is measured on the reticle pre-alignment stage PRA by observing a mark (not shown) on the reticle R by using a microscope (not shown). After the measurement, the reticle hand RSH holds the reticle R on the reticle pre-alignment stage PRA and is driven along a guide (not shown) in the Y direction to a position where the reticle R is to be transferred to the reticle stage RS. After the reticle hand RSH has been driven in the Y direction, the reticle hand RSH is driven in the −Z direction to transfer the reticle R to the reticle stage RS. The reticle stage RS holds the reticle R by, for example, vacuum chucking. Shifts in the X, Y, and θz directions with respect to the reticle pre-alignment stage PRA of the reticle R measured on the reticle pre-alignment stage PRA can be corrected by changing the position where the reticle stage RS is to receive the reticle R.

A wafer stage (substrate stage) WS as a first movable device that moves while holding a wafer (substrate) can include a wafer fine movement stage WSF and a wafer coarse movement stage WSC. A wafer chuck WC that holds the wafer is supported by the wafer fine movement stage WSF and can chuck and hold the wafer W. The wafer fine movement stage WSF can be driven straight in the X, Y, and Z directions and rotatably driven in the θx, θy, and θz directions. The driving operations in the respective directions can be controlled independently. A laser interferometer WLF and a plane mirror WBM are arranged to measure the position of the wafer fine movement stage WSF with high accuracy. The position of the stage can be determined from the displacement amount measured by the laser interferometer WLF.

Each pin-shaped member PIN can chuck and hold the wafer W and is used to receive the wafer W from a supply hand SH and to transfer the wafer W to a recovery hand RH. There are at least three pin-shaped members PIN arranged in the apparatus. The pin-shaped member PIN is fixed, for example, to the wafer coarse movement stage WSC and is installed in a direction perpendicular to the holding surface of the wafer chuck WC.

The wafer coarse movement stage WSC can be driven straight in the X direction and the Y direction and rotated about the Z-axis. The wafer coarse movement stage WSC can be controlled so as to follow the position of the wafer fine movement stage WSF with, for example, a wafer coarse movement stage interferometer (not shown) by using an actuator such as a linear motor or the like. The wafer coarse movement stage WSC is supported by, for example, an air guide WSG in the X direction and the Y direction. Contact friction does not occur due to the support by the air guide. Since the pin-shaped members PIN are fixed to the wafer coarse movement stage WSC, the pin-shaped members PIN move together with the wafer coarse movement stage WSC. The wafer coarse movement stage WSC can be driven in the X and Y directions in long strokes within a range that is defined by a limit sensor (not shown). On the other hand, since the wafer fine movement stage WSF has an arrangement in which it is mounted on the wafer coarse movement stage WSC, the wafer fine movement stage WSF can move in the X and Y directions only in strokes shorter than those of the wafer coarse movement stage WSC.

An off-axis scope OAS can measure an alignment mark on the wafer. A wafer conveyance system WF can include the supply hand SH, the recovery hand RH, a pre-alignment unit PA, a conveyance robot SCH, a temporary placement table RCV, and a container FOUP. The wafer W is contained in the container FOUP. The conveyance robot SCH is, for example, a multi-jointed robot. The conveyance robot SCH includes a hand for holding the wafer W and can move the hand to arbitrary positions in the XYZ space. The conveyance robot SCH takes out the wafer W from the container FOUP and places the wafer W on the pre-alignment unit PA. On the pre-alignment unit PA, the position of the outer shape of the wafer W with respect to the pre-alignment unit PA is measured by irradiating the peripheral portion of the wafer W with a measurement light and measuring the reflected light by a sensor.

The supply hand SH is a conveyance mechanism for transferring the wafer W from the pre-alignment unit PA to the wafer stage WS. The supply hand SH can hold the wafer W by, for example, vacuum chucking. A guide SHG is a guiding member that guides the movement of the supply hand SH in the Y direction. In this embodiment, the supply hand SH and the guide SHG form a second movable device that moves while holding an object (substrate) and transfers the substrate to the wafer stage WS. The supply hand SH is arranged so that it can hold the wafer and reciprocally move along the guide SHG (see FIG. 2). The supply hand SH can be driven along the guide SHG (see FIG. 2) in the Y direction by an actuator such as a linear motor or the like. The supply hand SH and the guide SHG are in contact with each other via, for example, a ball bearing.

The recovery hand RH is a part of a conveyance mechanism for transferring the wafer W from the wafer stage WS to the temporary placement table RCV. The recovery hand RH can hold the wafer W by, for example, vacuum chucking. The recovery hand RH can be driven along a guide RHG (see FIG. 2) in the Y direction by an actuator such as a linear motor. The recovery hand RH and the guide RHG are in contact with each other via a ball bearing. The temporary placement table RCV is a table on which the wafer W, which has been recovered from the wafer stage WS by the recovery hand RH, is placed temporarily. Since the conveyance robot SCH cannot directly take the wafer from the recovery hand RH, the conveyance robot SCH receives the wafer from the recovery hand RH via the temporary placement table RCV.

A control computer PC as a controller is a computer for controlling the exposure apparatus. The control computer PC is formed by a controller CONT, a calculator CALC, and a processor PROC. The controller CONT includes a driver and a controller for controlling the sensors and actuators described in the embodiment. The calculator CALC calculates a drive command value for moving the supply hand SH to a position to transfer the wafer W to the wafer stage WS and a drive command value for moving the wafer stage WS to a position to receive the wafer W. The processor PROC executes an exposure sequence and a wafer supply/recovery sequence according to a predetermined order.

The arrangement of the exposure apparatus according to this embodiment is mainly as described above. In this embodiment, the conveyance apparatus includes the wafer stage WS that serves as the first movable device which moves while holding an object (substrate) and the supply hand SH and the guide SHG that serve as the second movable device which moves while holding the substrate and transfers the substrate to the wafer stage WS. The conveyance apparatus further includes the control computer PC as a controller that controls the first movable device and the second movable device.

The procedure from the supplying of the wafer to the recovery of the wafer in the exposure apparatus according to this embodiment will be described next with reference to FIG. 2.

The processor PROC starts the sequence for supplying the wafer W to the exposure apparatus. The controller CONT controls the conveyance robot SCH to take the wafer W from the container FOUP and places the wafer W on the pre-alignment unit PA. As described above, the conveyance robot SCH performs the role of moving the wafer W from the container FOUP to the pre-alignment unit PA or moving the wafer W from the temporary placement table RCV to the container FOUP. The pre-alignment unit PA can irradiate the peripheral portion of the wafer with the measurement light and measure the position of the outer shape of the wafer by using a line sensor. The controller CONT measures the wafer placement position with respect to the pre-alignment unit PA. The wafer placement position is measured in relation to, for example, the three axes of the X-axis, the Y-axis, and the θz-axis. Next, the controller CONT controls the supply hand SH to take the wafer W from the pre-alignment unit PA, and drives the supply hand SH along the guide SHG in the +Y direction. The supply hand SH includes an encoder (not shown) and is driven (conveyed), by being driven for only a designated count, to a position above a supply position (an object transfer position) LP for transferring the wafer. The count number (target driving amount) necessary to drive the supply hand SH to the supply position LP is calculated by the calculator CALC.

Next, the controller CONT drives the wafer stage WS to the supply position LP. The calculator CALC determines the position of the supply position LP so that the center of the wafer chuck WC will match the center of the wafer W by reflecting the wafer placement position measured on the pre-alignment unit PA. The controller CONT drives the pin-shaped members PIN in the +Z direction to make the pin-shaped members PIN protrude from the surface of the wafer chuck WC so that the wafer W can be placed on the pin-shaped members PIN. Next, the controller CONT moves the supply hand SH in the −Z direction to transfer the wafer W onto the pin-shaped members PIN. After transferring the wafer W, the controller CONT drives the supply hand SH along the guide SHG in the −Y direction to retract the supply hand SH from the supply position LP. The controller CONT drives the pin-shaped members PIN in the −Z direction so that the pin-shaped members PIN will sink down into the wafer chuck WC. This causes the wafer W to be transferred from the pin-shaped members PIN to the wafer chuck WC. After the wafer W has been held by the wafer chuck WC, the processor PROC ends the supplying sequence of the wafer W. Although the wafer W was transferred to the pin-shaped members PIN by moving the supply hand SH in the −Z direction, the pin-shaped members PIN may move in the +Z direction to receive the wafer W.

After the completion of the supplying sequence of the wafer W, the exposure sequence of the wafer W is started by the processor PROC. After the completion of the exposure sequence, the recovery sequence of the wafer W is started by the processor PROC. The calculator CALC determines the position of a recovery position ULP for transferring the wafer W to the recovery hand RH. The controller CONT drives the wafer stage WS to the recovery position ULP. To transfer the wafer W from the wafer chuck WC to the pin-shaped members PIN, the controller CONT drives the pin-shaped members PIN in the +Z direction so that the pin-shaped members PIN will protrude from the surface of the wafer chuck WC. After the wafer W has been supported by the pin-shaped members PIN, the controller CONT controls the recovery hand RH so that the recovery hand RH will be driven along the recovery hand RH in the +Y direction to the recovery position ULP for receiving the wafer. The recovery hand RH includes an encoder (not shown) and is driven, by being driven only for a designated count, to a position above the recovery position ULP to receive the wafer. The count number necessary for driving the recovery hand RH to the recovery position is calculated by the calculator CALC.

After the recovery hand RH has reached the recovery position ULP, the controller CONT drives the recovery hand RH in the +Z direction to take the wafer W placed on the pin-shaped members PIN. The controller CONT drives the recovery hand RH which took the wafer W in the −Y direction and places the wafer W on the temporary placement table RCV. The controller CONT controls the conveyance robot SCH to take the wafer W on the temporary placement table RCV and to store the wafer W in the container FOUP. The recovery sequence performed by the processor PROC ends. Although the recovery hand RH moved in the +Z direction to receive the wafer W from the pin-shaped members PIN in this case, the pin-shaped members PIN may move in the −Z direction to transfer the wafer W to the recovery hand RH.

As described above, in a substrate processing apparatus, such as the exposure apparatus or the like, further improvement of object positioning accuracy at the time of reception/transfer of an object such as a substrate is desired. According to a study by the present inventor, it has become evident that the influence of heat due to the driving of the conveyance mechanisms cannot be ignored in order to transfer an object highly accurately. The generation of heat due to sliding friction accompanying the reciprocal movement of the supply hand SH along the guide SHG, the temperature of the guide SHG rises. When the reciprocal movement of the supply hand SH is repeated, the surface of the guide SHG on which the supply hand SH is guided thermally expands, and the driving completion position shifts in correspondence with the amount of deformation of the guide even if the supply hand SH is driven in accordance with the encoder. As a result, the center of the wafer chuck WC and the center of the wafer W will shift in the Y direction.

Figure 3:
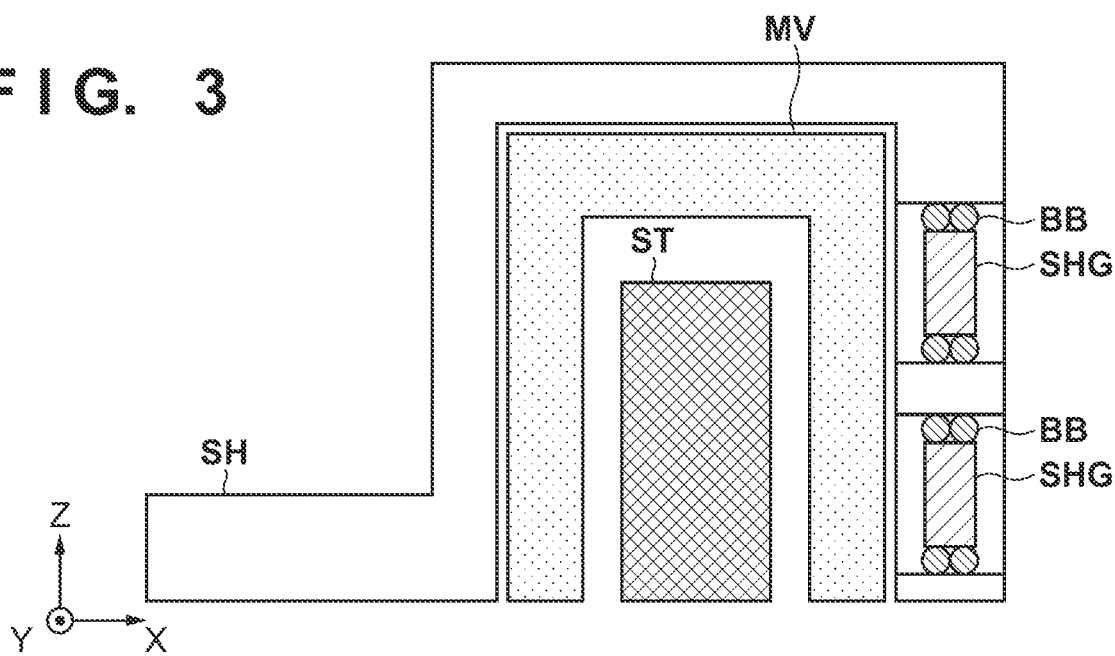
FIG. 3 is a sectional view of a supply hand SH and a guide SHG.

The generation mechanism of the sliding friction will be described in detail with reference to FIG. 3. FIG. 3 is a sectional view of the supply hand SH and the guide SHG. The supply hand SH is attached to a movable element MV. The supply hand SH is driven in the Y direction by a linear motor formed by a stator ST and the movable element MV. The supply hand SH is also supported by the guide SHG via a ball bearing BB. A plurality of balls of the ball bearing BB are arranged in the Y direction, and perform the role of making the driving operation in the Y direction smooth. A sliding friction is generated between the ball bearing BB and the guide SHG when the supply hand SH is driven, thus generating heat.

Hence, in this embodiment, the controller will estimate (predict) the thermal deformation amount of the guide SHG, due to the reciprocal movement of the supply hand SH along the guide SHG, based on the driving history of the supply hand SH. The controller will correct, based on the estimated thermal deformation amount, the drive command value used to move the wafer stage WS to a position (the supply position LP) for receiving the wafer from the supply hand SH. A more specific example of this correction will be described later as Example 1. Alternatively, the controller may correct, based on the estimated thermal deformation amount, the drive command value used to move the supply hand SH to a position (the supply position LP) for transferring the wafer to the wafer stage WS. A more specific example of this correction will be described later as Example 2.

Example 1

Figure 4:
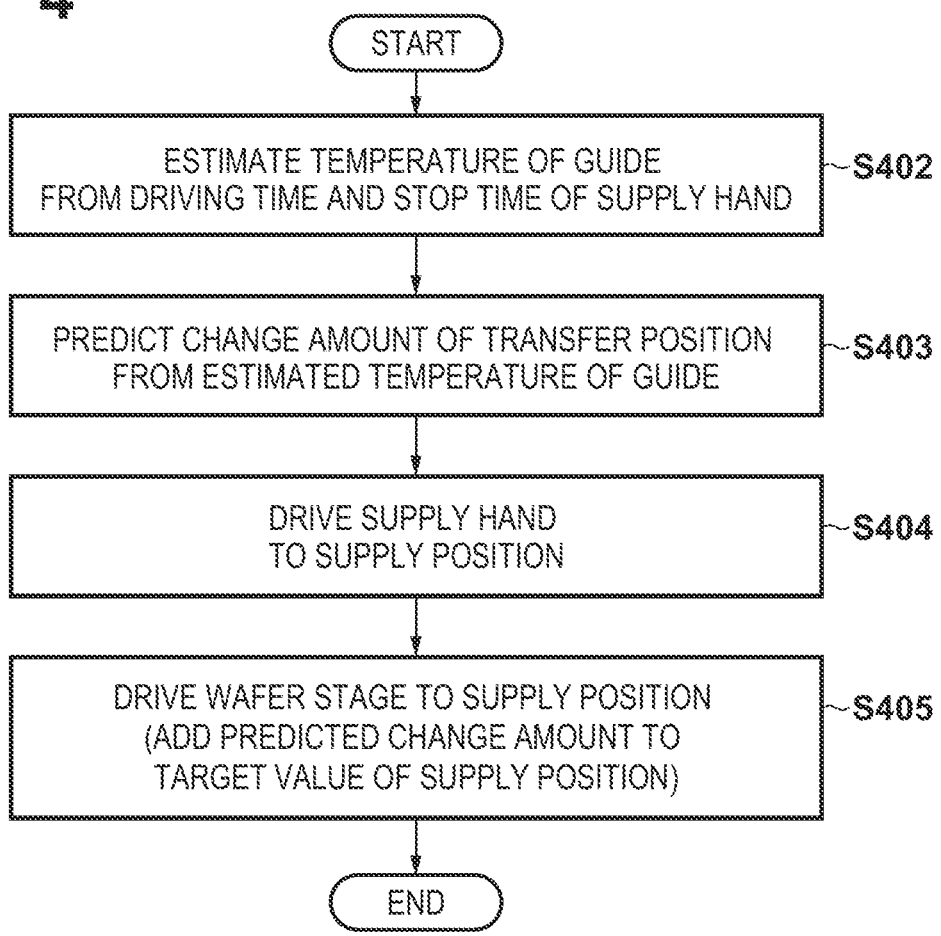
FIG. 4 is a flowchart of a substrate reception/transfer method according to Example 1.

Example 1 will describe an example in which the drive command value, which is used to move the wafer stage WS to the position (the supply position LP) for receiving the wafer from the supply hand SH, is corrected based on the driving history of the supply hand SH forming the second movable device. The positional shift, due to thermal deformation, in the driving operation performed to the supply position LP of the supply hand SH can be compensated by correcting the drive command value used to move the wafer stage WS. FIG. 4 is a flowchart of a substrate reception/transfer method according to Example 1. The processing according to this flowchart is performed each time a supply sequence is executed by the control computer PC which serves as the controller.

In step S402, the calculator CALC executes a calculation to estimate the temperature of the guide SHG from the driving time and the stop time of the supply hand SH. This estimation performed based on, for example, a first relationship which is a relationship between the stop time of the supply hand SH and the temperature drop of the guide SHG, and a second relationship which is a relationship between the driving time of the supply hand SH and the temperature rise of the guide SHG.

A more specific example will be shown. Let n be a wafer supply count, $T_c$ be an estimated temperature of the guide SHG during the driving stop of the supply hand SH, and $T_n$ be an estimated temperature of the guide SHG during the driving of the supply hand SH. Thus, the first relationship which is the relationship between the stop time of the supply hand SH and the temperature drop of the guide SHG is $$T_c = (T_{n-1} - T_{ec}) \times \exp\{-1 \times (SH\ stop\ time \div C\tau)\} + T_{ec} \quad (1)$$

Equation (1)(first relation) expresses a temperature drop curve determined by a convergence temperature $T_{ec}$ of the guide SHG when the supply hand SH is stopped and a time constant $C_\tau$ of the temperature drop of the guide SHG. In addition, the second relationship which is the relationship between the driving time of the supply hand SH and the temperature rise of the guide SHG is $$T_n = (T_{eh} - T_c) \times [1 - \exp\{-1 \times (SH\ driving\ time \div H\tau)\}] + T_c \quad (2)$$

Equation 2 (second relation) expresses a temperature rise curve determined by a convergence temperature $T_{eh}$ of the guide SHG when the supply hand SH is driven continuously and a time constant $H_\tau$ of the temperature rise of the guide SHG.

Figure 5:
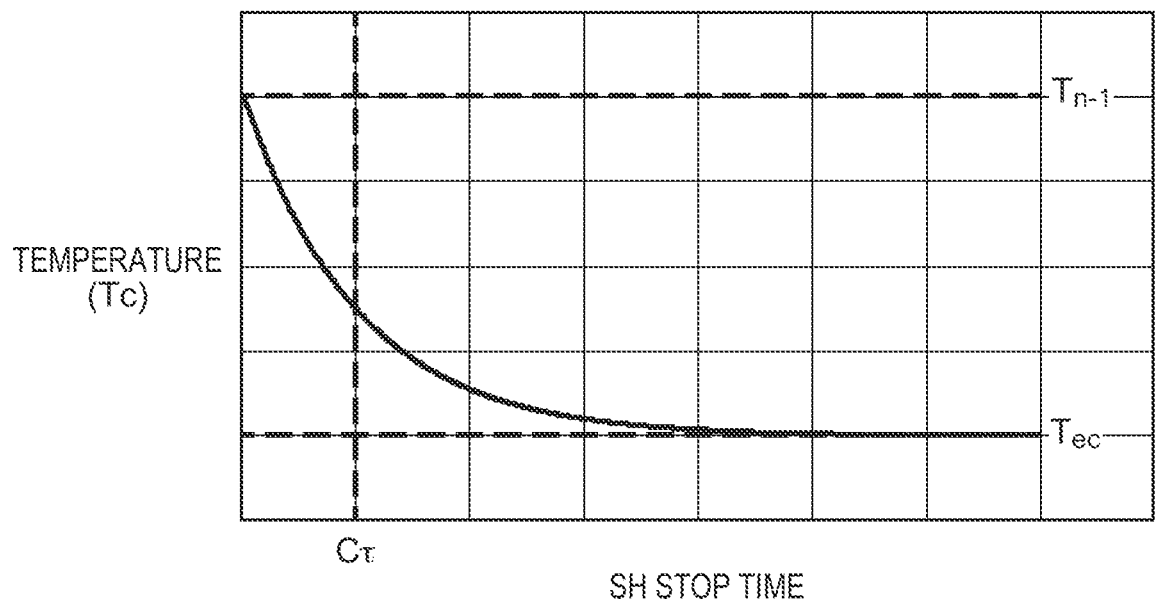
FIG. 5 is a graph showing an example of the relationship between the temperature and the stop time of a driving unit.

Equation (1) will be described with reference to FIG. 5. Equation (1) expresses a phenomenon in which the temperature of the guide SHG drops in accordance with the stop time of the supply hand SH. The temperature $T_c$ of the guide SHG is initially $T_{n-1}$. The longer the driving time of the SH is, the closer the temperature of the guide SHG will be to the convergence temperature $T_{ec}$. The time constant $C_\tau$ of the temperature drop of the guide SHG is, for example, time taken for the temperature of the estimated temperature $T_c$ to reach about 63.2% of a change amount $(T_{n1} - T_{ec})$.

Figure 6:
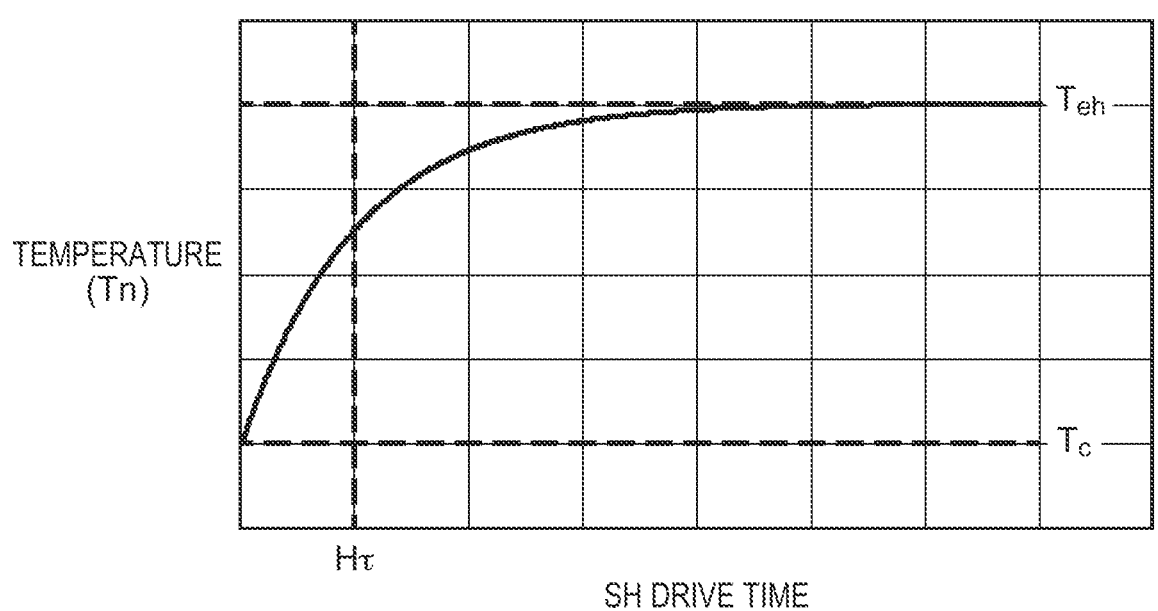
FIG. 6 is a graph showing an example of the relationship between the temperature and the driving time of the driving unit.

Equation (2) will be described next with reference to FIG. 6. Equation (2) expresses a phenomenon in which the temperature of the guide SHG rises in accordance with the driving time of the supply hand SH. The temperature $T_n$ of the guide SHG is initially $T_c$. The longer the driving time of the SH is, the closer the temperature of the guide SHG will be to the convergence temperature $T_{eh}$. The time constant $H_\tau$ of the temperature rise of the guide SHG is, for example, time taken for the temperature of the estimated temperature $T_n$ to reach about 63.2% of a change amount $(T_{eh} - T_c)$.

Figure 7:
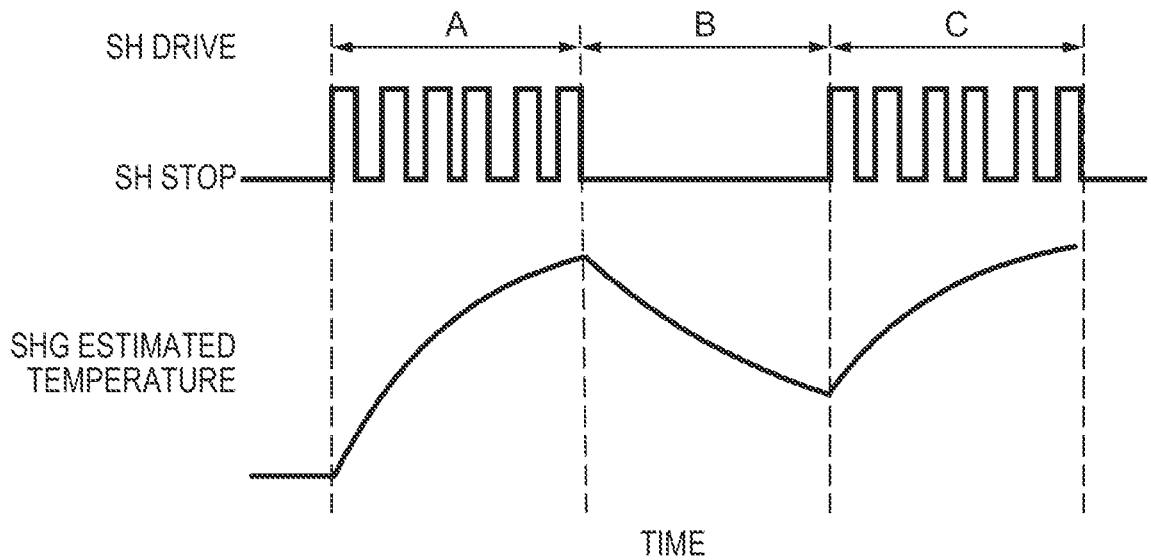
FIG. 7 is a chart showing an example of the relationship between the temperature, the driving time, and the stop time of the driving unit.

FIG. 7 is a chart expressing the relationship between the operation of the supply hand SH and the estimated temperature of the guide SHG which is obtained by equations (1) and (2). In FIG. 7, the exposure apparatus is operating in periods A and C, and the supply hand SH is repeatedly driven and stopped at predetermined intervals. The first period of the driving operation of the supply hand SH corresponds to processing performed on one wafer. Since the temperature rise obtained by equation (2) is stronger than the temperature drop obtained by equation (1) in the periods A and C, the temperature of the guide SHG will rise. On the other hand, in a period B, the exposure process has been stopped and the supply hand SH is in the stopped state. Hence, the temperature of the guide SHG falls in accordance with the temperature drop line of equation (1).

$T_{eh}$, $T_{ec}$, $H_\tau$, and $C_\tau$ are temperature change coefficients and need to be obtained in advance. $T_{eh}$ and $H_\tau$ can be obtained by continuously driving the supply hand SH along the guide SHG in the Y direction. The temperature change can be directly measured by attaching a thermometer on the guide SHG. $T_{ec}$ and $C_\tau$ can be directly measured by using the thermometer to measure the temperature change of the guide SHG without driving the supply hand SH after the temperature of the guide SHG has reached $T_{eh}$.

As another method, the temperature change can be estimated by measuring an alignment mark on the wafer W by the off-axis scope OAS without measuring the temperature. It is possible to estimate the temperature change by measuring the same mark on the same wafer to determine the change in the reception/transfer position.

The temperature change coefficients will change depending on the driving profile (the speed, the acceleration, and the jerk control condition) of the supply hand SH. Hence, the temperature change coefficients may be obtained for each driving profile used in the apparatus. Also, the temperature change coefficient may be obtained for each predetermined cumulative driving count of the supply hand SH. This is because the friction coefficient of the supply hand SH and the guide SHG may change due to degradation over time. For example, the deterioration of the lubrication performance of grease can be raised as one factor of this variation.

In step S403, the calculator CALC estimates a change amount (that is, a thermal deformation amount of the guide SHG corresponding to the reciprocal movement of the supply hand SH along the guide SHG) of the reception/transfer position based on the temperature of the guide SHG estimated in step S402. For example, this thermal deformation amount $\Delta Y_n$ can be estimated by $$\Delta Y_n = F(T_n) \tag{3}$$

where a coefficient F can be expressed as an equation that linearly changed along with, for example, the temperature change of the guide SHG by $$F(x) = Ax + B \tag{4}$$

The method of obtaining a coefficient A and an intercept B of equation (4) will be described. The change in the wafer reception/transfer position can be understood by measuring the alignment mark on the wafer W by the off-axis scope OAS. For example, the alignment mark on the wafer W is measured after the receiving/transferring of the wafer is performed under two temperature patterns $T_{eh}$ and $T_{ec}$ of the guide SHG. The coefficient A can be obtained from the change in the measurement position of the alignment mark when the temperature of the guide SHG is $T_{eh}$ and that when the temperature of the guide is $T_{ec}$. Next, the intercept B can be obtained from the measurement position of the alignment mark when the temperature of the guide SHG is $T_{eh}$.

As another method, the coefficient F may be set as a polynomial equation. In this case, the measurement of the alignment mark can be performed by changing the temperature of the guide SHG a plurality of times, and the measurement results can be fitted into a polynomial equation to obtain the coefficient.

Next, in step S404, the controller CONT drives the supply hand SH along the guide SHG to the supply position LP (the object reception/transfer position). Although the driving stop position will change depending on the temperature of the guide SHG, the driving stop position is not corrected (is influenced by the temperature change) at the point of step S403 in this example. In step S405, after the driving operation of the supply hand SH to the supply position LP has been completed, the controller CONT drives the wafer stage WS to the supply position LP. At this time, the calculator CALC will correct, based on the thermal deformation amount estimated in step S403, the drive command value used to move the wafer stage WS to the supply position LP. In this manner, the positional relationship between the wafer W and the wafer stage WS can be kept constant by correcting the target driving amount of the wafer stage WS to the supply position LP based on the driving history of the supply hand SH.

As described above, the control computer PC ends the processing for correcting the change in the reception/transfer position of the supply hand SH by changing the position where the wafer stage WS is to receive the wafer W.

Example 2

Figure 8:
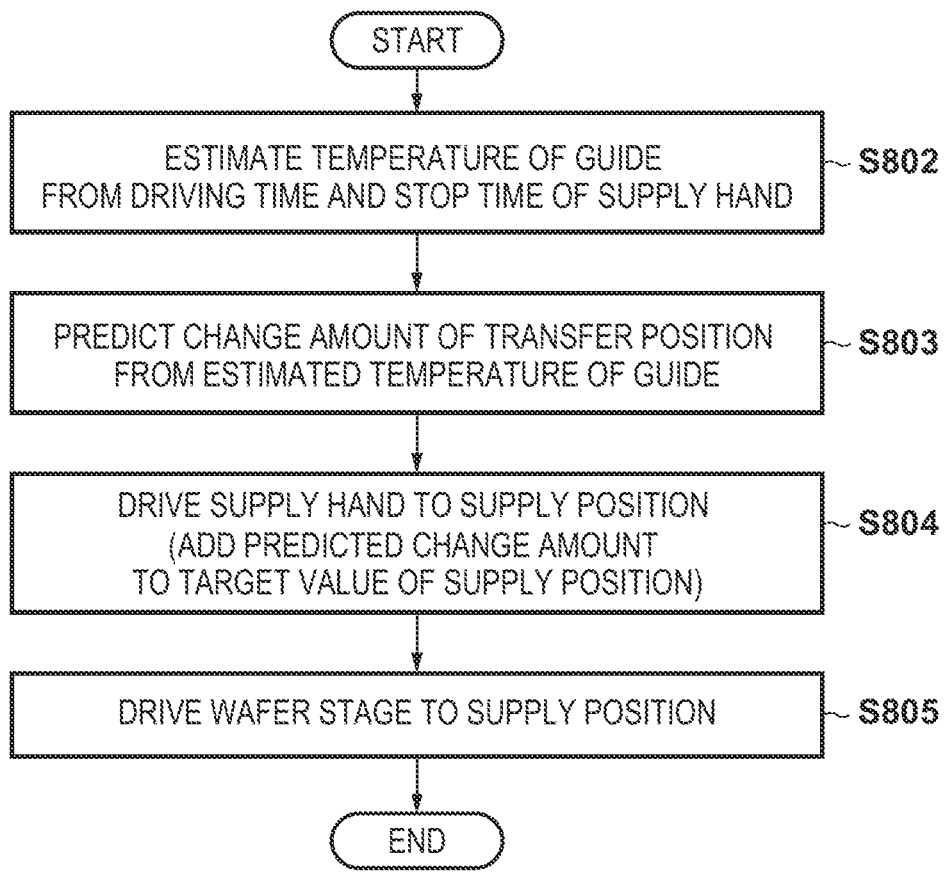
FIG. 8 is a flowchart of a substrate reception/transfer method according to Example 2.

A substrate reception/transfer method of Example 2 will be described with reference to FIG. 8. FIG. 8 is a flowchart of the substrate reception/transfer method according to Example 2. The above Example 1 described an example in which the drive command value used to move the wafer stage WS to the position (the supply position LP) for receiving the wafer from the supply hand SH is corrected based on the driving history of the supply hand SH. In contrast, Example 2 will describe an example in which the drive command value used to move the supply hand SH to the position (the supply position LP) for transferring the wafer to the wafer stage WS is corrected based on the driving history of the supply hand SH. The positional shift, due to thermal deformation, in the driving operation performed to the supply position LP of the supply hand SH is compensated by correcting the drive command value used to move the supply hand SH. The processing according to the flowchart of FIG. 8 is performed each time a supply sequence is performed by the control computer PC which serves as the controller.

In step S802, the calculator CALC performs a calculation to estimate the temperature of the guide SHG based on the driving time and the stop time of the supply hand SH. In step S802, the temperature of the guide SHG is estimated by a method similar to that of step S402 in Example 1.

In step S803, the calculator CALC estimates the change amount (that is, the thermal deformation amount of the guide SHG corresponding to the reciprocal movement of the supply hand SH along the guide SHG) of the reception/transfer position based on the temperature of the guide SHG estimated in step S802. In step S803, the change amount of the reception/transfer position is estimated by a method similar to that of step S403 in Example 1.

Next, in step S804, the controller CONT drives the supply hand SH along the guide SHG to the supply position LP (the object reception/transfer position). At this time, the calculator CALC corrects the drive command value for moving the supply hand SH to the supply position LP based on the thermal deformation amount estimated in step S803. In this manner, the positional relationship between the wafer W and the wafer stage WS can be kept constant by correcting the target driving amount of the supply hand SH to the supply position LP based on the driving history of the supply hand SH. In step S805, after the driving operation of the supply hand SH to the supply position LP is completed, the controller CONT drives the wafer stage WS to the supply position LP.

In Example 2, the change amount of the reception/transfer position estimated in step S803 is not reflected onto the driving target position of the wafer stage WS by the calculator CALC. This is because the position of the supply hand SH has already been corrected in step S804. The control computer PC ends the processing for correcting the change in the reception/transfer position of the supply hand SH by changing the position where the supply hand SH receives/transfers the wafer W.

Example 3

Figure 9:
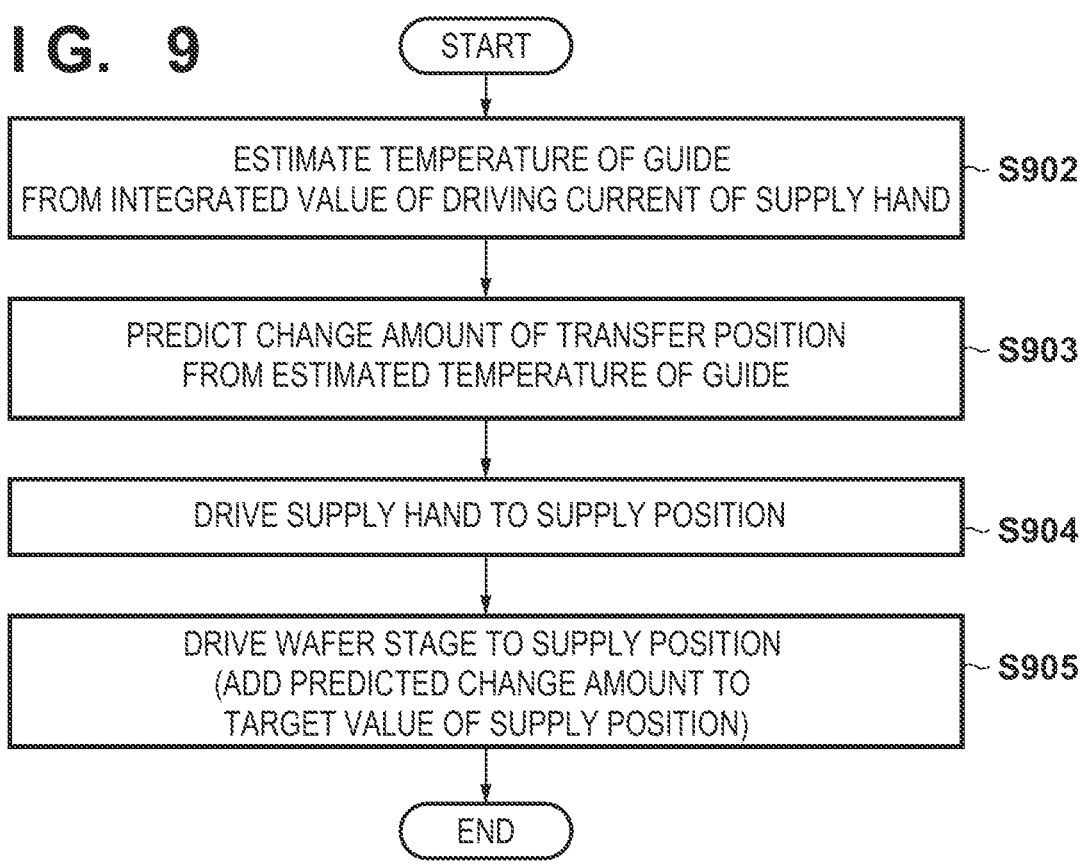
FIG. 9 is a flowchart of a substrate reception/transfer method according to Example 3.

A substrate reception/transfer method according to Example 3 will be described next with reference to FIG. 9. FIG. 9 is a flowchart of the substrate reception/transfer method according to Example 3. In Example 1 described above, the temperature of the guide SHG is estimated from the driving time and the stop time of the supply hand SH. In contrast, Example 3 will estimate the temperature of the guide SHG based on an integrated value of the driving current of the supply hand SH. The processing according to the flowchart of FIG. 9 is performed each time a supply sequence is performed by the control computer PC which serves as the controller.

In step S902, the calculator CALC performs a calculation to estimate the temperature of the guide SHG from the integrated value of the driving current of the supply hand SH. In Example 3, the driving current value of the supply hand SH is used as the driving history. In this case, letting n be the wafer supply count and $T_n$ be the estimated temperature of the guide, $T_n$ can be estimated by $$T_n = H_c \times R \times I^2 \times \text{SMPL\_TIME} + C_c \times T_{n-1} \qquad (5)$$

where $H_c$ indicates a temperature rise coefficient, $C_c$ indicates a temperature drop coefficient, R indicates a resistance value of the coil of the linear motor driving the supply hand SH, I indicates a current value of the linear motor driving the supply hand SH, and SMPL_TIME indicates a period at which the current value is output.

$H_c$ and $C_c$ are temperature change coefficients and need to be obtained in advance. $H_c$ can be obtained by driving the supply hand SH continuously along the guide SHG in the Y direction. The temperature change can be directly measured by attaching a thermometer on the guide SHG. $C_c$ can be directly measured by using the thermometer to measure the temperature change of the guide SHG without driving the supply hand SH after the temperature of the guide SHG has reached the terminal temperature of the driving operation.

As another method, the temperature change can be estimated by measuring the alignment mark on the wafer W by the off-axis scope OAS without measuring the temperature. It is possible to estimate the temperature change by measuring the same mark on the same wafer to determine the change in the reception/transfer position.

The temperature change coefficients will change depending on the driving profile (the speed, the acceleration, and the jerk control condition) of the supply hand SH. Hence, the temperature change coefficients may be obtained for each driving profile used in the apparatus. Also, the temperature change coefficient may be obtained for each predetermined cumulative driving count of the supply hand SH. This is because the friction coefficient of the supply hand SH and the guide SHG may change due to degradation over time. For example, the deterioration of the lubrication performance of grease can be raised as one factor of this change.

In step S903, the calculator CALC estimates the change amount (that is, the thermal deformation amount of the guide SHG corresponding to the reciprocal movement of the supply hand SH along the guide SHG) of the reception/transfer position based on the temperature of the guide SHG estimated in step S902. In step S903, the change amount of the reception/transfer position is estimated by a method similar to that of step S403 in Example 1.

Next, in step S904, the controller CONT drives the supply hand SH along the guide SHG to the supply position LP. In step S905, after the driving operation of the supply hand SH to the supply position LP has been completed, the controller CONT drives the wafer stage WS to the supply position LP. At this time, the calculator CALC will correct the drive command value used to move the wafer stage WS to the supply position LP based on the thermal deformation amount estimated in step S903. In this manner, the positional relationship between the wafer W and the wafer stage WS can be kept constant by correcting the target driving amount of the wafer stage WS to the supply position LP based on the integrated value of the driving current which serves as the driving history of the supply hand SH.

The control computer PC ends the processing for correcting the change in the reception/transfer position of the supply hand SH by changing the position where the wafer stage WS receives the wafer W.

Example 4

Figure 10:
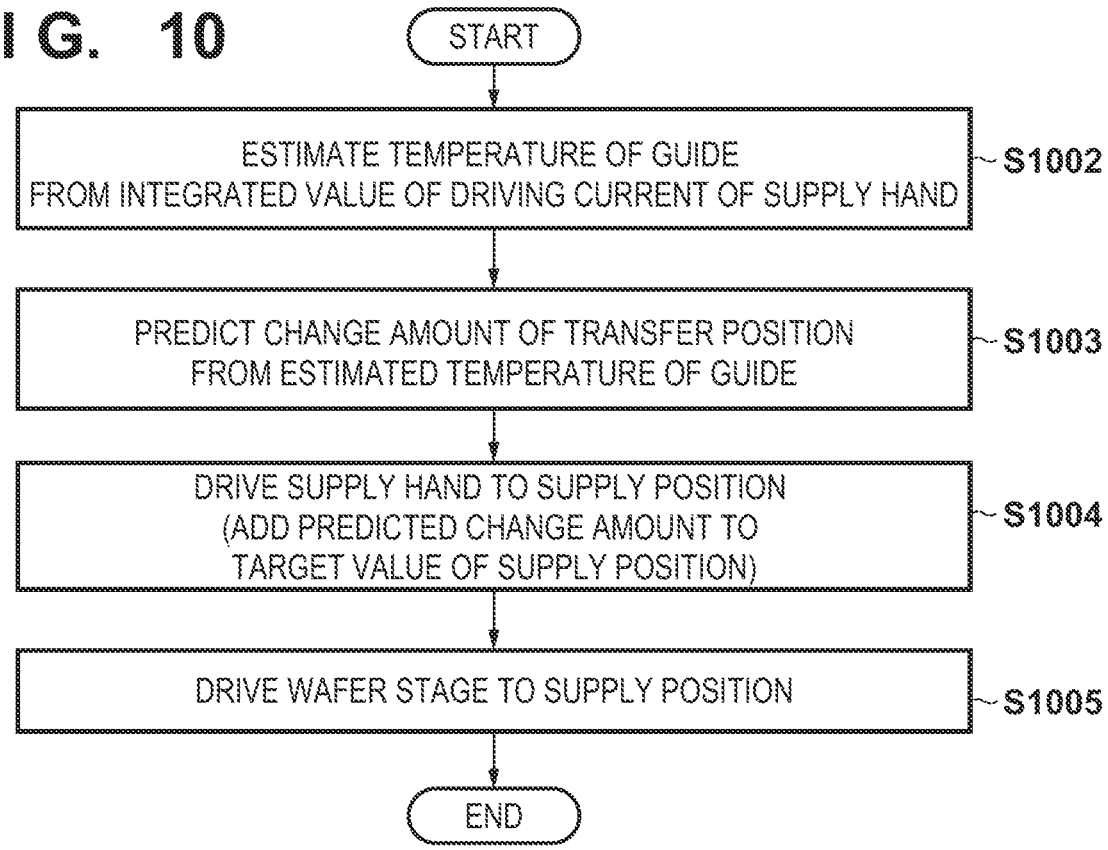
FIG. 10 is a flowchart of a substrate reception/transfer method according to Example 4.

A substrate reception/transfer method according to Example 4 will be described next with reference to FIG. 10. FIG. 10 is a flowchart of the substrate reception/transfer method according to Example 4. The above Example 3 described an example in which the drive command value used to move the wafer stage WS to the position (the supply position LP) for receiving the wafer from the supply hand SH is corrected based on the integrated value of the driving current which serves as the driving history of the supply hand SH. In contrast, Example 4 will describe an example in which the drive command value used to move the supply hand SH to the position (the supply position LP) for transferring the wafer to the wafer stage WS is corrected based on the integrated value of the driving current of the supply hand SH. The positional shift, due to thermal deformation, in the driving operation performed to the supply position LP of the supply hand SH is compensated by correcting the drive command value used to move the supply hand SH in a manner similar to Example 3. The processing according to the flowchart of FIG. 10 is performed each time a supply sequence is performed by the control computer PC which serves as the controller.

In step S1002, the calculator CALC performs an operation to estimate the temperature of the guide SHG from the integrated value of the driving current of the supply hand SH. In step S1002, the temperature of the guide SHG is estimated by a method similar to that of step S902 in Example 3.

In step S1003, the calculator CALC estimates the change amount (that is, the thermal deformation amount of the guide SHG corresponding to the reciprocal movement of the supply hand SH along the guide SHG) of the reception/transfer position based on the temperature of the guide SHG estimated in step S1002. In step S1003, the change amount of the reception/transfer position is estimated by a method similar to that of step S403 in Example 1.

Next, in step S1004, the controller CONT drives the supply hand SH along the guide SHG to the supply position LP. At this time, the calculator CALC corrects the drive command value used to move the supply hand SH to the supply position LP based on the thermal deformation amount estimated in step S1003. In this manner, the positional relationship between the wafer W and the wafer stage WS can be kept constant by correcting the target driving amount of the supply position LP of the supply hand SH based on the integrated value of the driving current of the supply hand SH. In step S1005, after the driving operation of the supply hand SH to the supply position LP has been completed, the controller CONT drives the wafer stage WS to the supply position LP.

In Example 4, the change amount of the reception/transfer position estimated in step S1003 is not reflected on the driving target position of the wafer stage by the calculator CALC. This is because the position of the supply hand SH has already been corrected in step S1004. The control computer PC ends the processing for correcting the change in the reception/transfer position of the supply hand SH by changing the position where the supply hand SH receives/transfers the wafer W.

As described above, the first embodiment described a method of correcting a change in the reception/transfer position where the supply hand SH receives/transfers the wafer W from/to the wafer stage WS. This method can be applied to the correction of the change in the reception/transfer position where the reticle hand RSH receives/transfers the reticle R from/to the reticle stage RS in a similar manner.

Second Embodiment

The first embodiment described the thermal expansion of a guide SHG due to the sliding friction caused by the driving operation of a supply hand SH. The second embodiment will focus on the thermal expansion of a plate of a wafer fine movement stage WSF due to the driving of a wafer stage WS. The thermal expansion of the plate of the wafer fine movement stage WSF will change the positional relationship between a plane mirror WBM and a wafer chuck WC. Hence, the center position of the wafer chuck WC when the wafer stage WS is driven to a supply position LP will change due to the temperature of the plate. Therefore, in this embodiment, the change in the position where the wafer stage WS receives a wafer W is corrected by changing the wafer reception/transfer position.

In this embodiment, the change in the reception position is estimated by the driving history of the wafer stage WS. The estimated change is corrected in accordance with the position where the wafer stage WS is to receive the wafer W or the position where the supply hand SH is to transfer the substrate. Executing estimation based on the driving history of the wafer stage WS allows the contents of Examples 1 to 4 according to the first embodiment described above to be applied to the second embodiment.

Note that the method according to this second embodiment is applicable to the correction of the change in the position where a reticle stage RS is to receive a reticle. The change in the reception/transfer position is estimated based on the driving history of the reticle stage RS, and the position where the reticle stage RS is to receive a reticle R or the position where a reticle hand RSH is to receive/transfer the reticle R is corrected.

Third Embodiment

The first embodiment and the second embodiment each described an example in which a guide SHG is estimated by using relations such as equation (1), (2), or (5). In the third embodiment, a neural network (an estimation model) that has been trained by using training data indicating the relationship between the temperature of the guide SHG and the driving time and the stop time of a supply hand SH is obtained. The driving time and the stop time of the supply hand SH are input to the obtained estimation model to obtain the temperature of the guide SHG as an output. In this case, a neural network is, for example, a hierarchical neural network that has a multilayer network structure, and an estimation model can be obtained by inputting training data and using an algorithm such as error back-propagation. Note that the training data can be obtained based on experiments and simulations. Also, an estimation model trained by using training data that indicates the relationship between the temperature of the guide SHG and an integrated value of the driving current of the supply hand SH may be obtained. It may be set so that the temperature of the guide SHG will be obtained as an output by inputting the integrated value of the driving current of the supply hand SH in the obtained estimation model.

In addition, the first embodiment and the second embodiment each described an example in which the change amount of the reception/transfer position is estimated by using a relation such as equation (3) or (4). In the third embodiment, the change amount of the reception/transfer position will be estimated by obtaining an estimation model trained by using training data indicating the relationship between the change amount of the reception/transfer position and the temperature of the guide SHG. That is, it may be set so that the change amount of the reception/transfer position will be obtained as an output by inputting the temperature of the guide SHG in the obtained estimation model.

The third embodiment may also estimate the change amount of the reception/transfer position by obtaining an estimation model trained by using training data indicating the relationship between the change amount of the reception/transfer position and the driving time and the stop time of the supply hand SH or the relationship between the change amount of the reception/transfer position and the integrated value of the driving current. That is, it may be set so that the change amount of the transfer position will be obtained as an output by inputting the driving time and the stop time of the supply hand SH or the integrated value of the driving current in the obtained estimation model.

Furthermore, training data may be prepared for each predetermined cumulative driving count of the supply hand SH, and a plurality of estimation models may be obtained for each predetermined cumulative driving count of the supply hand SH. The temperature of the guide SHG or the change amount of the reception/transfer position may be estimated by using a different estimation model for each for each predetermined cumulative driving count of the supply hand SH. This is because the friction coefficient between the supply hand SH and the guide SHG may change over the years.

In addition, although the first to third embodiments each described an example of an arrangement using the supply hand SH, each example is also similarly applicable to reception/transfer performed between a recovery hand RH and a wafer stage WS.

<Embodiment of Method of Manufacturing Article>

A method of manufacturing an article according to the embodiment of the present invention is suitable for manufacturing an article such as a microdevice such as a semiconductor device or an element having a microstructure. The method of manufacturing an article according to the embodiment can include a step of forming a pattern of an original on a substrate by using the above-described substrate processing apparatus (an exposure apparatus, an imprint apparatus, a drawing apparatus, or the like), and a step of processing the substrate on which the pattern has been formed in the preceding step. Furthermore, this article manufacturing method can include other well-known steps (oxidization, deposition, vapor deposition, doping, planarization, etching, resist removal, dicing, bonding, packaging, and the like). The method of manufacturing an article according to the embodiment is superior to a conventional method in at least one of the performance, quality, productivity, and production cost of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-240140, filed Dec. 21, 2018, which is hereby incorporated by reference herein in its entirety.

What is claimed is:

1. A conveyance apparatus comprising:
a first movable device including a stage configured to move while holding an object;
a second movable device including a hand configured to move while holding the object and transfer the object to the first movable device; and
a controller configured to control the first movable device and the second movable device, wherein:
the second movable device includes a guide member, and the hand is arranged so as to reciprocally move along the guide member while holding the object,
the controller is configured to estimate, based on a driving history of the hand, a thermal deformation amount of the guide member due to the reciprocal movement of the hand along the guide member,
the controller is configured to correct, based on the estimated thermal deformation amount, a drive command value used to move the first movable device to a position to receive the object from the second movable device,
the thermal deformation amount is estimated from the driving history of the hand, based on one or more relational equations for obtaining a temperature of the guide member from the driving history of the hand and for obtaining the thermal deformation amount of the guide member from the temperature of the guide member, and
the one or more relational equations include a coefficient predetermined according to a driving profile that defines a control condition of a speed, an acceleration, or a jerk of the hand.

2. The apparatus according to claim 1, wherein the controller is configured to:
estimate the temperature of the guide member from the driving history of the hand, based on a relational equation for obtaining the temperature of the guide member from the driving history of the hand; and
estimate the thermal deformation amount from the estimated temperature, based on a relational equation for obtaining the thermal deformation amount of the guide member from the temperature of the guide member.

3. The apparatus according to claim 2, wherein the controller is configured to obtain, as the driving history of the hand, an integrated value of a driving current of the second movable device and estimates the temperature of the guide member from the integrated value.

4. The apparatus according to claim 1, wherein the relational equation includes:
a first relationship equation that indicates a relationship between a stop time of the hand and a temperature drop of the guide member; and
a second relationship equation that indicates a relationship between a driving time of the hand and a temperature rise of the guide member.

5. The apparatus according to claim 4, wherein coefficients in the first relationship equation include a convergence temperature of the guide member when the hand is stopped and a time constant of the temperature drop of the guide member, and
coefficients in the second relationship equation include a convergence temperature of the guide member when the hand is continuously driven and a time constant of the temperature rise of the guide member.

6. The apparatus according to claim 1, wherein the coefficient is determined in accordance with the driving profile and a cumulative driving count of the hand.

7. A substrate processing apparatus that forms a pattern on a substrate, comprising:
a conveyance apparatus defined in claim 1,
wherein the object is the substrate, and
the stage is a substrate stage configured to hold the substrate.

8. A method of manufacturing an article, comprising:
forming a pattern on a substrate by using a substrate processing apparatus defined in claim 7; and
processing the substrate on which the pattern has been formed,
wherein the article is manufactured from the processed substrate.

9. A substrate processing apparatus that uses an original to form a pattern on a substrate, comprising:
a conveyance apparatus defined in claim 1,
wherein the object is the original, and
the stage is an original stage configured to hold the original.

10. A method of manufacturing an article, comprising:
forming a pattern on a substrate by using a substrate processing apparatus defined in claim 9; and
processing the substrate on which the pattern has been formed,
wherein the article is manufactured from the processed substrate.

11. A conveyance apparatus comprising:
a first movable device including a stage configured to move while holding an object;
a second movable device including a hand configured to move while holding the object and transfer the object to the first movable device; and
a controller configured to control the first movable device and the second movable device, wherein:
the second movable device includes a guide member, and the hand is arranged so as to reciprocally move along the guide member while holding the object,
the controller is configured to estimate, based on a driving history of the hand, a thermal deformation amount of the guide member due to the reciprocal movement of the hand along the guide member,
the controller is configured to correct, based on the estimated thermal deformation amount, a drive command value used to move the hand to a position to transfer the object to the first movable device,
the thermal deformation amount is estimated from the driving history of the hand, based on one or more relational equations for obtaining a temperature of the guide member from the driving history of the hand and for obtaining the thermal deformation amount of the guide member from the temperature of the guide member, and
the one or more relational equations include a coefficient predetermined according to a driving profile that defines a control condition of a speed, an acceleration, or a jerk of the hand.

* * * * *